(12) United States Patent
Su et al.

(10) Patent No.: US 8,008,850 B2
(45) Date of Patent: Aug. 30, 2011

(54) COLOR TEMPERATURE TUNABLE WHITE LIGHT EMITTING DEVICE

(75) Inventors: Jung-Chieh Su, Taipei (TW); Chun-Lin Lu, Taipei (TW)

(73) Assignee: National Taiwan University of Science & Technology, Taipei (TW)

(*) Notice: Subject to any disclaimer, the term of this patent is extended or adjusted under 35 U.S.C. 154(b) by 183 days.

(21) Appl. No.: 12/607,713

(22) Filed: Oct. 28, 2009

(65) Prior Publication Data

US 2011/0025183 A1   Feb. 3, 2011

(30) Foreign Application Priority Data

Jul. 31, 2009  (TW) .................. 98125802 A

(51) Int. Cl.
*H01J 1/62* (2006.01)
(52) U.S. Cl. .................. 313/498; 362/231; 313/506
(58) Field of Classification Search .......... 313/484–487, 313/489, 498, 512, 467, 468, 499, 501–503; 362/235, 227, 231, 293, 545, 555, 800
See application file for complete search history.

(56) References Cited

U.S. PATENT DOCUMENTS

| | | | | |
|---|---|---|---|---|
| 7,176,612 | B2* | 2/2007 | Omoto et al. | 313/487 |
| 7,800,287 | B2* | 9/2010 | Zheng et al. | 313/112 |
| 2003/0133292 | A1* | 7/2003 | Mueller et al. | 362/231 |
| 2007/0064407 | A1* | 3/2007 | Huang et al. | 362/19 |
| 2008/0151527 | A1* | 6/2008 | Ueno et al. | 362/84 |
| 2008/0230795 | A1* | 9/2008 | Dias | 257/98 |
| 2010/0001297 | A1* | 1/2010 | Takashima et al. | 257/88 |
| 2010/0001648 | A1* | 1/2010 | De Clercq et al. | 315/113 |
| 2010/0200872 | A1* | 8/2010 | Takashima | 257/89 |
| 2010/0244058 | A1* | 9/2010 | Weng et al. | 257/88 |
| 2010/0254127 | A1* | 10/2010 | Yang | 362/231 |
| 2010/0302771 | A1* | 12/2010 | Yang et al. | 362/231 |
| 2011/0037081 | A1* | 2/2011 | Kuo et al. | 257/89 |

* cited by examiner

*Primary Examiner* — Peter MacChiarolo

(57) ABSTRACT

A color temperature tunable white light emitting device is provided, including a substrate with an ultraviolet light emitting diode, a purple light emitting diode, and a blue light emitting diode provided over the substrate. The UV LED, the purple LED and the blue LED are coated with a phosphor layer. An omnidirectional reflector is disposed over the phosphor layer. A medium layer is disposed between the omnidirectional reflector and the phosphor layer. A transparent substrate is disposed over the omnidirectional reflector and an optical diffuser is disposed over the transparent substrate.

17 Claims, 4 Drawing Sheets

COLOR TEMPERATURE TUNABLE WHITE LIGHT EMITTING DEVICE

CROSS REFERENCE TO RELATED APPLICATIONS

This application claims priority of Taiwan Patent Application No. 98125802, filed on Jul. 31, 2009, the entirety of which is incorporated by reference herein.

BACKGROUND OF THE INVENTION

1. Field of the Invention

The present invention relates to light emitting devices, and in particular, to a white light-emitting device capable of emitting white light with color temperature tunability.

2. Description of the Related Art

White light-emitting diodes (LEDs) are point light sources that are packaged as a matrix LED for illumination. White light is produced by combining at least two chromatic lights with different wavelengths, such as a blue and yellow light of complementary color or a blue, green and red light.

There are three types of white LEDs presently available. One type uses a white light LED module composed of red, blue and green LEDs, with high luminous efficacy, high color rendering, and real-time tunable color temperature. However, tri-color LED (red, blue and green LED) with different epitaxial materials exhibit different electrical and aging properties, resulting in high cost and complicated driving circuit design for implementation. Also, there is an issue of non-uniform spatial distribution of white light for mixing trichromatic light due to the placement of tri-color LEDs.

Another type of white LED uses a blue LED to excite yellow phosphors to produce white light. The blue LED is coated by an optical resin mixed with yellow phosphors. The blue LED emits blue light with a wavelength of 400-530 nm. The yellow phosphors are excited by the blue light emitted from the blue LED to produce yellow light, and a portion of blue light mixing with the generated yellow light to form the white light with complementary colors. However, the method wherein the white LED uses the blue LED to excite the yellow phosphors has some drawbacks. First, the large amount of transmitted blue light power result in high color temperatures and non-uniform white light distribution. Second, the wavelength of blue light shifts with the LED junction temperature rises, resulting in changes of chromaticity coordinates of the emitted white light. Third, due to the predetermined admixing ratio between yellow phosphor and optical resin of the phosphor resin layer, the color temperature of the white light mixing blue and yellow light is fixed and with limited color temperature tunability.

Still another type of white LED uses ultraviolet (UV) or purple LED to excite multi-color phosphors mixed in transparent optical resin with a specific ratio between phosphors. The UV or purple LED emits UV light or purple light with a wavelength of 320-400 nm. The multi-color phosphors are excited by the UV light or purple light emitted from the UV or purple LED to produce white light. This method has uniform white light distribution and simple driving circuit design for implementation.

However, the method wherein the white LED uses the UV or purple LED to excite the multi-color phosphor has some drawbacks. First, there is a leakage of the purple light or UV light, and this limits its applications. Second, the fixed color temperature of the emitted white light results from the predetermined phosphors in resin ratio, and can not be tuned in real time.

In summary, the above three white LED packaging methods for emitting white light have at least one of the following drawbacks. First, the emitted white light is provided with fixed color temperature. Second, the color temperature of the emitted white light can not be tuned in real time. Third, the light distribution of the mixing white light is non-uniform. Thus, the color temperature of the white light cannot be tuned for lighting applications, and according to the user preference or requirements of lighting applications

BRIEF SUMMARY OF THE INVENTION

Therefore, a color temperature tunable light emitting device capable of emitting white light with real-time tunability is provided to solve the above drawbacks.

An exemplary color temperature tunable white light emitting device comprises a substrate with an ultraviolet light-emitting diode (UV LED) disposed thereover, electrically connected to the substrate, wherein the UV LED has a first emission surface for emitting ultraviolet (UV) light. A purple light-emitting diode (purple LED) is disposed over the substrate to electrically connect with the substrate, wherein the purple LED has a second emission surface for emitting purple light. A blue light-emitting diode (blue LED) is disposed over the substrate to electrically connect with the substrate, wherein the blue LED has a third emission surface for emitting blue light. A phosphor layer is coated around the UV LED, the purple LED, and the blue LED, wherein the phosphor layer is formed by blending phosphors of the at least two color phosphors in a transparent optical resin, and the phosphors of the at least two color phosphors in the transparent optical resin are excited by the UV light from the UV LED and the purple light from the purple LED to thereby emit visible light. The blue light from the blue LED combines with the visible light from the phosphors to emit white light. An omni-directional reflector is disposed over the phosphor layer and opposite to the first emission surface of the UV LED, the second emission surface of the purple LED, and the third emission surface of the blue LED. A medium layer is disposed between the omni-directional reflector and the phosphor layer, wherein the medium layer has a refractive index that is less than a refractive index of the phosphor layer and the omni-directional reflector. A transparent substrate is disposed over the omni-directional reflector, wherein the transparent substrate has opposite first and second surfaces, and the first surface of the transparent substrate is in contact with the omni-directional reflector. An optical diffuser is disposed over the second surface of the transparent substrate.

Another exemplary color temperature tunable white light emitting device comprise a substrate with a pair of first metal pins, a pair of second metal pins, and a pair of third meta pins disposed along opposite ends of the substrate, respectively. An ultraviolet light-emitting diode (UV LED) is disposed over the substrate to electrically connect with the pair of first metal pin, wherein the UV LED has a first emission surface for emitting ultraviolet (UV) light. A purple light-emitting diode (purple LED) is disposed over the substrate to electrically connect with the pair of second metal pin, wherein the purple LED has a second emission surface for emitting purple light. A blue light-emitting diode (blue LED) is disposed over the substrate to electrically connect with the pair of third metal pin, wherein the blue LED has a third emission surface for emitting blue light. A transparent layer is coated around the UV LED, the purple LED, and the blue LED, wherein the transparent layer comprise materials that are transparent to the UV light, the purple light and the blue light. A phosphor layer is formed over the transparent layer, wherein the phosphor layer is formed by blending phosphors of the at least two colors in a transparent optical resin, and the phosphors of the at least two colors in the transparent optical resin are excited by the UV light from the UV LED and the purple light from the purple LED to thereby emit visible light. The blue light from the blue LED combines with the visible light from the phosphors to emit white light. An omni-directional reflector is disposed over the phosphor layer and opposite to the first emission surface of the UV LED, the second emission surface of the purple LED, and the third emission surface of the blue LED. A medium layer is disposed between the omni-directional reflector and the phosphor layer, wherein the medium layer has a refractive index that is less than that of the phosphor layer. A transparent substrate is disposed over the omni-directional reflector, wherein the transparent substrate has opposite first and second surfaces, and the first surface of the transparent substrate is in contact with the omni-directional reflector. An optical diffuser is disposed over the second surface of the transparent substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-7 are schematic diagrams illustrating different exemplary color temperature tunable white light emitting devices.

Figure 1:
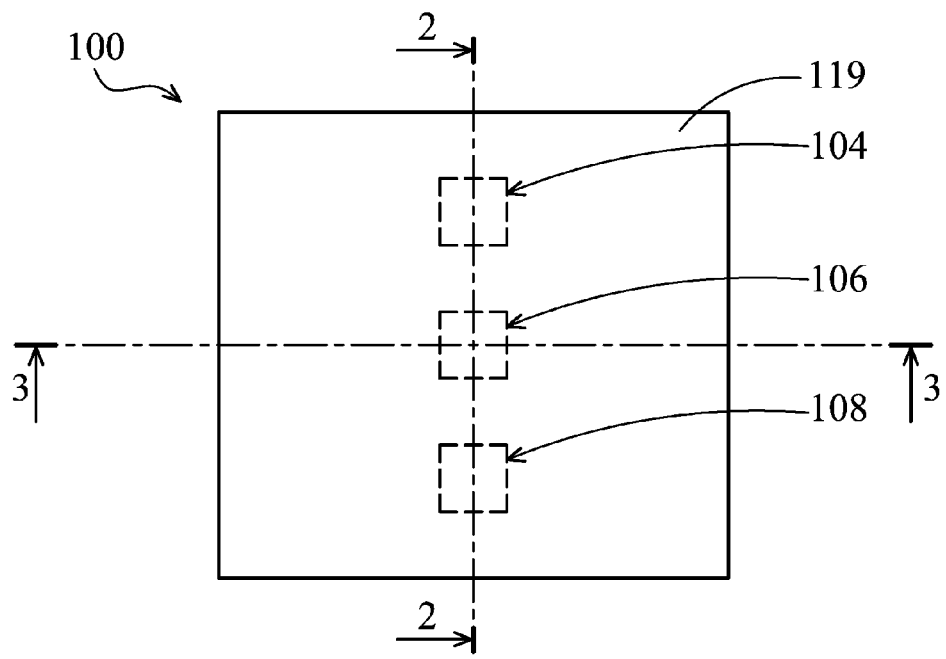
FIG. 1 is a top view of a color temperature tunable white light emitting device according to an embodiment of the invention.
Figure 2:
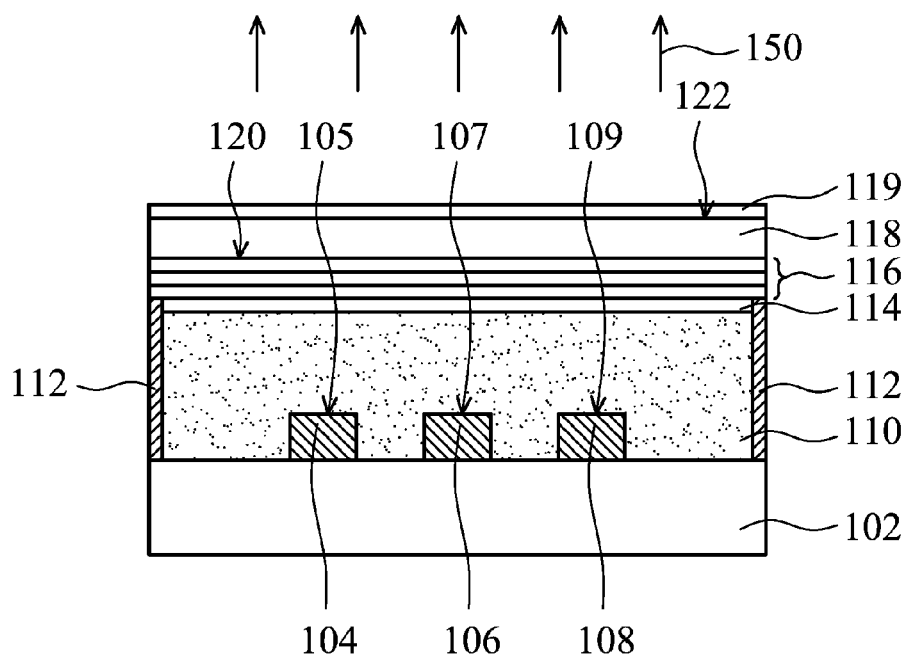
FIG. 2 shows a cross section along line 2-2 in FIG. 1.
Figure 3:
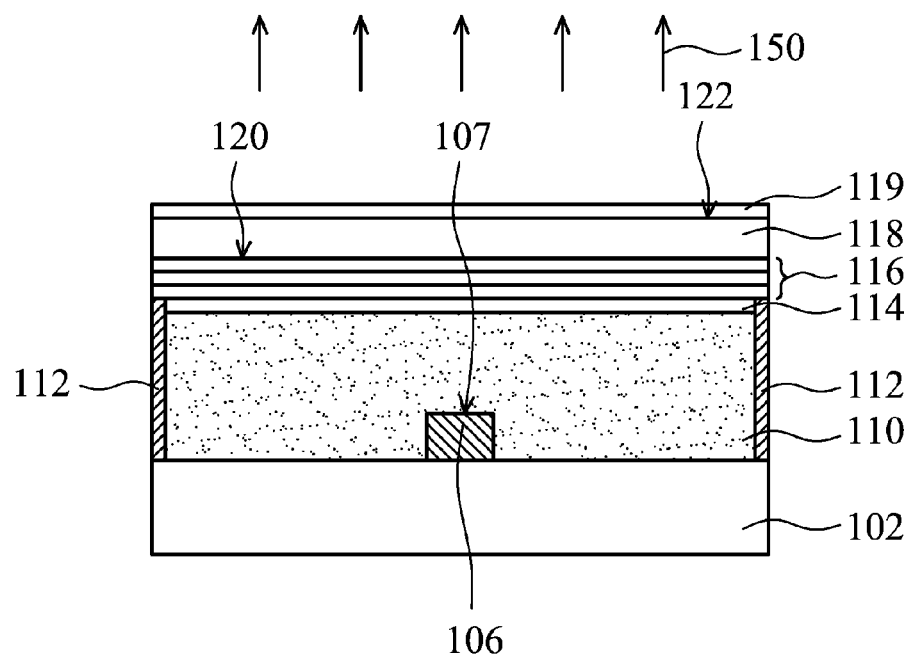
FIG. 3 shows a cross section along line 3-3 in FIG. 1.

FIGS. 1-3 are schematic diagrams of an exemplary color temperature tunable white light emitting device 100, wherein FIG. 1 shows a top view and FIGS. 2-3 show cross sections along line 2-2 and 3-3 in FIG. 1, respectively.

As shown in FIGS. 1 and 2, the white light emitting device 100 mainly comprises a substrate 102, an ultraviolet light emitting diode (UV LED) 104, a purple light emitting diode (purple LED) 106 and a blue light emitting diode 108 (blue LED) having emitting light of different wavelength, a phosphor layer 110, an omni-directional reflector 116, a transparent substrate 118, a side reflector 112, and an optical diffuser 119. In FIG. 1, due to configuration of components, only the UV LED 104 (illustrated in dotted line), the purple LED 106 (illustrated in dotted line), and the blue LED 108 (illustrated in dotted line) covered by the optical diffuser 119 are illustrated, for simplicity. Herein, the UV LED 104, the purple LED 106, and the blue LED 108 disposed over the substrate (not shown) are aligned along a column direction, but placements of the UV LED 104, the purple LED 106, and the blue LED 108 are not limited by that illustrated in FIG. 1.

As shown in FIG. 2, a medium 114 is disposed between the phosphor layer 110 and the omni-directional reflector 116 to isolate the phosphor layer 110 from the omni-directional reflector 116. The omni-directional reflector 116 may improve luminous efficacy of the white light emitting device 100 and prevent ultraviolet light emission from the UV LED 104 emitted from the white light emitting device 100. In addition, a color temperature of white light 150 emitted by the white light emitting device 100 is tunable by properly changing a driving current applied to the UV LED 104, the purple LED 106 and the blue LED 108. Thus, the white light 150 is a color temperature tunable white light and the color temperature of the white light 150 is tunable in a range between 3000K-9000K. Structures and functionalities of the components of the exemplary white light emitting device 100 will be discussed in detail as follows.

In FIG. 2, the substrate 102 can be a circuit substrate with predetermined electrodes such as positive and negative electrodes (not shown) or a circuit element such as a circuit (not shown) to electrically connect with the UV LED 104, the purple LED 106, and the blue LED 108. The substrate 102 may also reflect the visible light produced by exciting the phosphors of predetermined colors (not shown) in the phosphor layer 108 with the UV light emitted by the UV LED 104 and the purple light emitted by the purple LED 106. Herein, the UV LED 104, the purple LED 106, and the blue LED 108 are disposed over different positions of the substrate 102 along a column direction and can be driven by applying currents thereto for emitting UV light, purple light and blue light. The UV light can be emitted from an emission surface 105 of the UV LED 104, the purple light can be emitted from an emission surface 107 of the purple LED 106, and the blue light can be emitted from an emission surface 109 of the blue LED 108, thereby functioning as a light source for exciting the phosphor layer 108.

In one embodiment, the UV LED 104 may emit UV light having a wavelength of about 320~400 nm, the purple LED 106 may emit purple light having a wavelength of about 400~450 nm, and the blue LED 108 may emit blue light having a wavelength of about 450~490 nm which is different from the purple light.

In one embodiment, the white light emitting device 100 is illustrated with merely a UV LED 104, a purple LED 106, and a blue LED 108 therein. However, to meet different illumination power density requirements, a plurality of UV LEDs 104, a plurality of purple LEDs 106, and a plurality of blue LEDs 108 can be repeatedly formed over the substrate 102 in, for example, an array configuration.

In FIG. 2, the phosphor layer 110 can be coated over the substrate 102 and surrounds the UV LED 104, the purple LED 106, and the blue LED 108, and the phosphors in the phosphor layer 110 can be excited when the UV light emitted from the UV LED 104 and the purple light emitted from the purple LED 106 passes through the phosphor layer 110 to thereby emit visible light of a predetermined color, wherein the visible light is then mixed with the blue light emitted from the blue LED 108 to form the white light 150.

In one embodiment, the phosphor layer 110 may comprise a transparent optical resin blended with phosphors of the at least two different colors in specific phosphor ratios corresponding to the UV light from the UV LED 104 and the purple light from the purple LED 106. The transparent optical resin is transparent to the UV light, the purple light and the blue light, and the phosphors in the transparent optical resin can be, for example, red color phosphors, orange color phosphors, yellow color phosphors, and green color phosphors. The UV LED 104, the purple LED 106, and the blue LED 108 may comprise the same types of III-V epitaxial material systems, such as GaN, InGaAlN, InGaN or AlGaN chips. Therefore, the UV LED 104, the purple LED 106 and the blue LED 108 have similar operation voltages and similar life time and this is advantageous for operation of the white light emitting device 100.

In one embodiment, the phosphor layer 110 may comprise a transparent resin such as epoxy or a silicon resin which is transparent to UV light, purple light and visible light. The phosphors in the phosphor layer 110 may be of green, orange, yellow and red colors. Since the UV LED 104 emits ultraviolet (UV) light with a wavelength of 320-400 nm and the purple LED 106 emits purple light with a wavelength of 400~450 nm, therefore the phosphors in the phosphor layer 110 can be excited by the UV light and the purple light to emit visible light such as green light, orange light, yellow light and red light. The excited visible light is then mixed with the blue light emitted from the blue LED 108 to form the white light 150.

As shown FIG. 3, the omni-directional reflector 116 is disposed over the phosphor layer 110 and is oppositely disposed over the emission surface 105 of the UV LED chip 104, the emission surface 107 of the purple LED 106, and the emission surface 109 of the blue LED 108. The omni-directional reflector 116 and the phosphor layer 110 are separated by the medium 114. The medium 114 may have a refractive index that is less than the refractive index of the phosphor layer 110 and the omni-directional reflector 116, such as about of 1~1.5. In one embodiment, the medium 114 can be, for example, an air gap. In addition, a transparent substrate 118 is disposed over the omni-directional reflector 116. The transparent substrate 118 has opposing first surface 120 and second surface 122, and the first surface 120 physically contacts with the omni-directional reflector 116. An optical diffuser 119 is provided over the second surface 122 of the transparent substrate 118 to thereby homogenize the distribution of the output white light 150.

Figure 4:
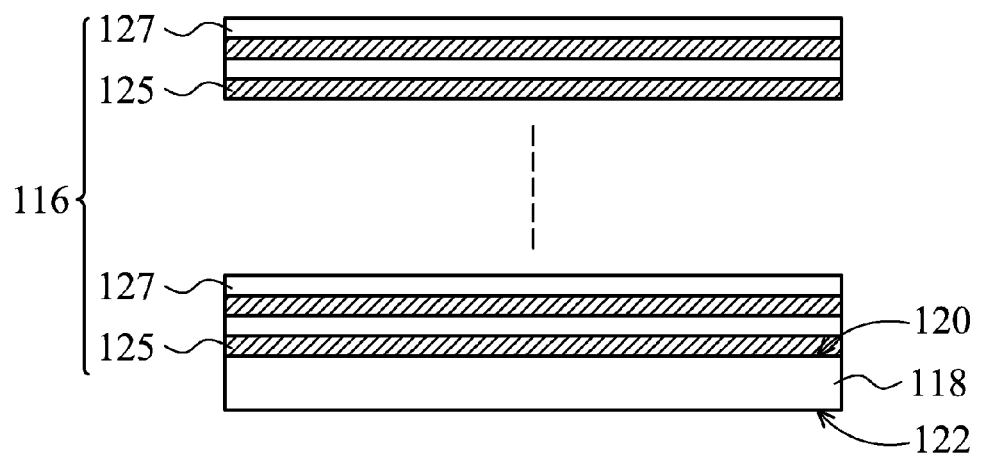
FIG. 4 is schematic diagram of an omni-directional reflector according to an embodiment of the invention.

In FIG. 4, an exemplary embodiment of the omni-directional reflector 116 in FIGS. 2 and 3 is illustrated. Herein, the omni-directional reflector 116 can be formed over a surface 120 of the transparent substrate 118 by methods such as sputtering, electro-gun (E-gun), or chemical vapor deposition. Materials and thickness of the coating layers of the omni-directional reflector 116 can be chosen to meet predetermined optical reflectance requirements, to omni-directionally reflect light of a predetermined wavelength from the UV LED 104, and to partially reflect light of a predetermined wavelength from the purple LED 106 and the visible light generated by excitation of the phosphor layer 108 and the blue light of a predetermined wavelength from the blue LED 108. Thus, the omni-directional reflector 116 is designed for the UV LED 104 and has high reflectance of more than 90% to the emitting light with all emitting angles and different electric field polarizations. In addition, through the use of the medium 114 disposed between the omni-directional reflector 116 and the phosphor layer 110, the reflectance of the omni-directional reflector 116 for the UV light from the UV LED 104 at large incident angle increased and transmission of the UV light through the omni-directional reflector 116 is prevented.

In this embodiment, the omni-directional reflector 116 is formed by alternately depositing a low refractive index layer 125 and a high refractive index layer 127 on the surface 120 of the transparent substrate 118. The transparent substrate 118 comprises highly transmissive materials, such as glass, to visible light generated by excitation of the phosphor layer 110. The low refractive index layer 125 is a layer having a refractive index that is less than that of the high refractive index layer 127 and has a refractive index of about 1.4-1.9. The low refractive index layer 125 comprises materials such as $SiO_2$, $Al_2O_3$, $MgO$, $La_2O_3$, $Yb_2O_3$, $Y_2O_3$, $Sc_2O_3$, $WO_3$, $LiF$, $NaF$, $MgF_2$, $CaF_2$, $SrF_2$, $BaF_2$, $AlF_3$, $LaF_3$, $NdF_3$, $YF_3$, $CeF_3$ or combinations thereof. The high refractive index layer 127 has a refractive index of more than that of the low refractive index layer 125 and has a refractive index of about 2-3. The high refractive index layer 127 comprises materials such as $TiO_2$, $Ta_2O_5$, $ZrO_2$, $ZnO$, $Nd_2O_3$, $Nb_2O_5$, $In_2O_3$, $SnO_2$, $SbO_3$, $HfO_2$, $CeO_2$, $ZnS$, or combinations thereof.

As shown in FIGS. 2 and 3, a side reflector 112 is formed around the phosphor layer 110 to thereby reflect the light incident on the side reflector 112 back to the phosphor layer 108. Thus, the UV light emitted from the UV LED 104, the purple light emitted from the purple LED 106, and the blue light emitted from the blue LED 108 can be incident into the omni-directional reflector 116 formed over the phosphor layer 110 at all angle of incidence. However, since the omni-directional reflector 116 and the side reflector 112 around the phosphor layer 110 reflect light wave of predetermined wavelengths, the UV light emitted from the UV LED 104 and is confined between the reflective substrate 102, for all wavelength and the omni-directional reflector 116. With the use of the side reflector 106, the UV light emitted from the UV LED 104 can be repeatedly and omnidirectionally reflected between the phosphor layer 110 and the omni-directional reflector 116.

Whenever the UV light from the UV LED 104 and the purple light from the purple LED 106 pass through the phosphor layer 110, the phosphors in the phosphor layer 110 will be excited and emitted secondary visible light. The secondary visible light reflected in the space among the omni-directional reflector 116, the substrate 102 and the side reflector 112 excite the phosphors in the phosphor layer 110 and convert the energy of the light from the UV LED 104 and the purple LED 106 to improve phosphor conversion efficiency and enable the white light emitting device 100 to emit a maximum amount of white light 150.

Figure 5:
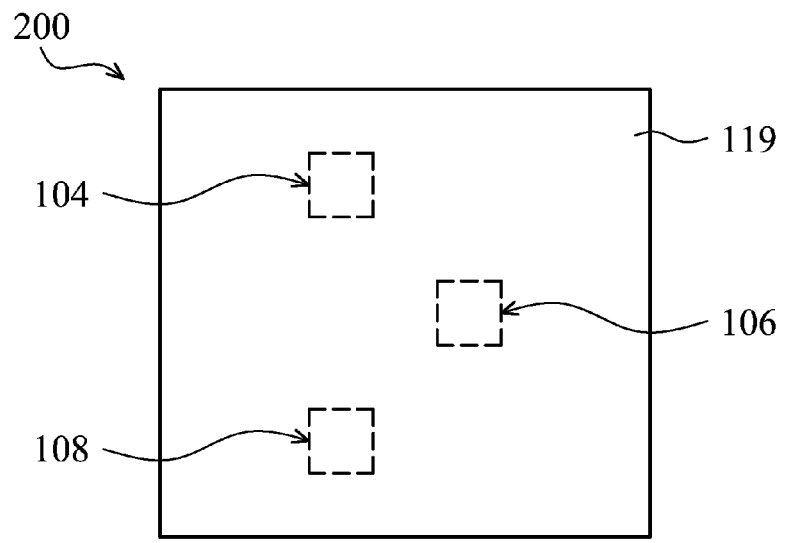
FIG. 5 is a top view of a color temperature tunable white light emitting device according to another embodiment of the invention.

FIG. 5 is a top view showing another exemplary color temperature tunable white light emitting device 200 which is similar with the white light emitting device 100 shown in FIG. 1. In this embodiment, the UV LED 104, the purple LED 106, and the blue LED 108 disposed over the substrate (not shown) are arranged in an array having a substantially triangular shape.

Figure 6:
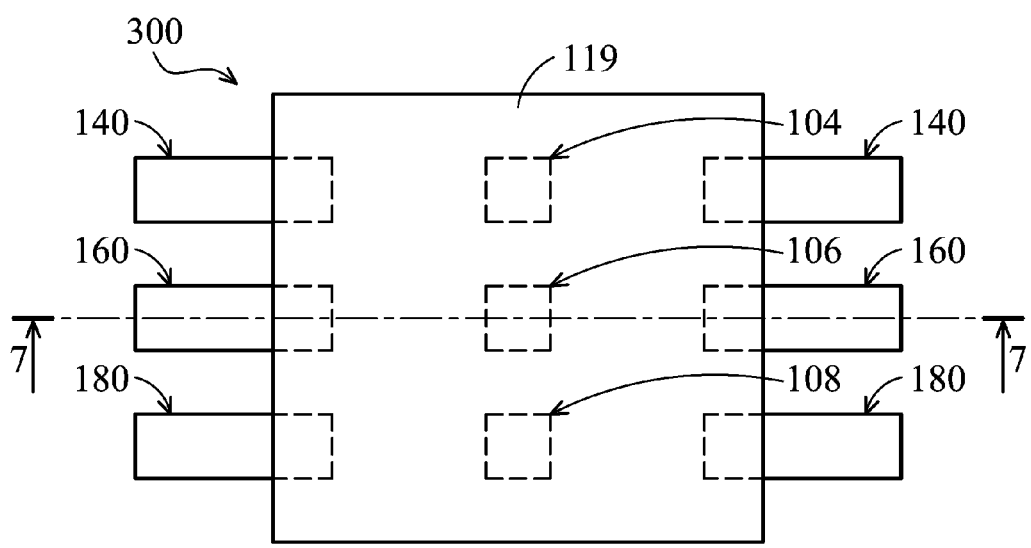
FIG. 6 is a top view of a color temperature tunable white light emitting device according to yet another embodiment of the invention.
Figure 7:
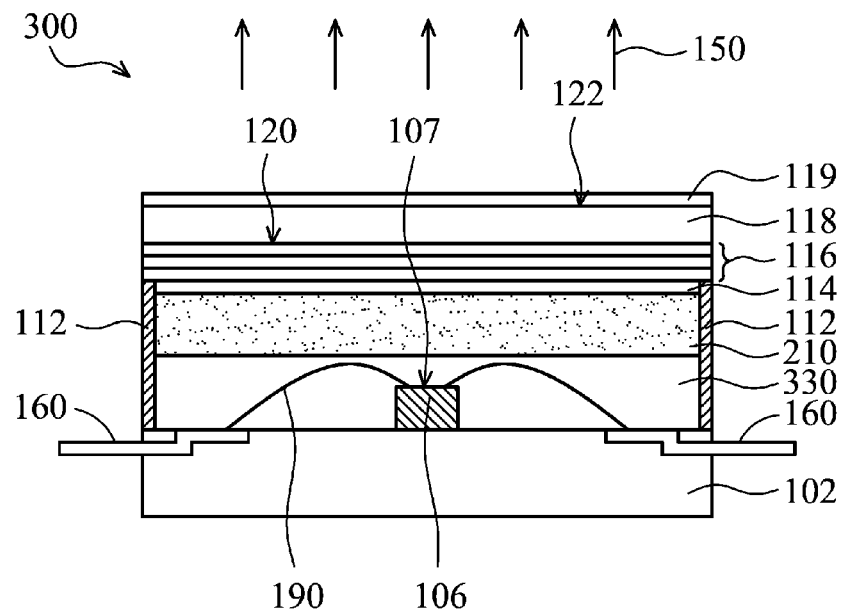
FIG. 7 shows a cross section along line 7-7 in FIG. 6.

FIGS. 6-7 show a top view of yet another exemplary color temperature tunable white light emitting device 300, wherein FIG. 6 is a top view of the white light emitting device 300 and FIG. 7 is a cross section along line 7-7 in FIG. 6. The white light emitting device 300 shown in FIGS. 6-7 is similar with the white light emitting device 100 shown in FIGS. 1 and 3, wherein same numeral references represent same components and only differences therebetween are discussed as below.

As shown in FIG. 6, a plurality pairs of metal pin 140, 160, and 180 electrically connecting with the UV LED 104, the purple LED 106 and the blue LED 108 are additionally formed in the substrate. The pairs of metal pin are disposed along opposing sides of the substrate and are electrically connected to the UV LED 104, the purple LED 106 and the blue LED 108 formed over the substrate by a bond wire (not shown). The UV LED 104 can be driven by receiving driving currents from the metal pins 140 to emit UV light, the purple LED 106 can be driven by receiving driving currents from the metal pins 160 to emit purple light, and the blue LED 108 can be driven by receiving driving currents from the metal pins 180 to emit blue light.

In addition, as shown in FIG. 7, a transparent layer 330 is additional coated on and surrounds the UV LED 104, the purple LED 106 and the blue LED 108 formed over the substrate 102. The transparent layer 330 is covering the UV LED 104, the purple LED 106 and the blue LED 108, and materials of the transparent layer 330 can be epoxy resin or silicon resin which are transparent to the emitting light such as UV light, purple light and blue light. The phosphor layer 110 is coated over the transparent layer 330, and the omni-directional reflector 116 is disposed over the phosphor layer 110 at a place opposite to the emission surface 105 of the UV LED 104, the emission surface 107 of the purple LED 106, and the emission surface 109 of the blue LED 108. The omni-directional reflector 116 is spaced from the phosphor layer 110 by the medium 114. The medium 114 may have a refractive index that is less than the refractive index of the phosphor layer 110 and the omni-directional reflector 116, such as about of 1~1.5. In one embodiment, the medium 110 can be, for example, an air gap.

In FIG. 7, the pair of spaced metal pins 140 is formed in the substrate 102 and penetrates opposing sidewalls of the substrate 102. Each of the metal pins 140 is respectively connected with an anode and a cathode (not shown) of the UV LED 140 by a bond wire 190. Therefore, driving currents can be applied on the metal pins to thereby drive the UV LED 104 to emit UV light. The UV light can be emitted from the emission surface 105 of the UV LED 104. Similarly, the purple LED 106 and the blue LED 108 are configured and driven in similar ways. Herein, the bond wire 190 is embedded in the transparent layer 330. In addition, an optical diffuser 119 is provided over the second surface 122 of the transparent substrate 118 to thereby homogenize the distribution of the emitted white light 150.

In this embodiment, the UV LED 104, the purple LED 106 and the blue LED 108, the phosphor layer 110, the optical diffuser 119, the omni-directional reflector 116 and the transparent substrate 118 are the same with that disclosed in the embodiments illustrated by FIGS. 1-3 and are not described here in detail, for simplicity.

Example

The white light emitting device 300 illustrated in FIGS. 6-7 was carried out for demonstration. The white light emitting device 300 was provided with a UV LED 104 made of an InGaN chip for emitting UV light having a wavelength of about 372 nm, a purple LED 106 made of an InGaN chip for emitting purple light having a wavelength of about 412 nm, and a blue LED 108 made of an InGaN chip for emitting blue light having a wavelength of about 460 nm. The phosphor layer 110 was provided with phosphors of red and green colors, and the UV LED 104, the purple LED 106 and blue LED 108 were driven by different driving currents to thereby obtain the measured results showing color gamut and color temperature of the color temperature tunable white light emitting device 300. Table 1 shows the experimental results in the demonstration.

TABLE 1

|  | Operating current of UV LED 104 (mA) | Operating current of purple LED 106 (mA) | Operating current of blue LED 108 (mA) | Color coordinate (x) | Color coordinate (y) | Color Temperature (K) |
|---|---|---|---|---|---|---|
| Example 1 | 91.6 | 8.5 | 53.9 | 0.3130 | 0.2868 | 6956 |
| Example 2 | 91.6 | 3.5 | 54.0 | 0.3076 | 0.2850 | 7450 |
| Example 3 | 91.7 | 11.3 | 50.5 | 0.3486 | 0.3400 | 4812 |
| Example 4 | 91.7 | 3.5 | 35.3 | 0.4759 | 0.5076 | 3137 |
| Example 5 | 91.6 | 3.5 | 55.3 | 0.2960 | 0.2799 | 8746 |
| Example 6 | 91.6 | 15.8 | 53.1 | 0.3442 | 0.3496 | 5026 |
| Example 7 | 91.7 | 1.0 | 44.7 | 0.3347 | 0.3384 | 5398 |

Figure 8:
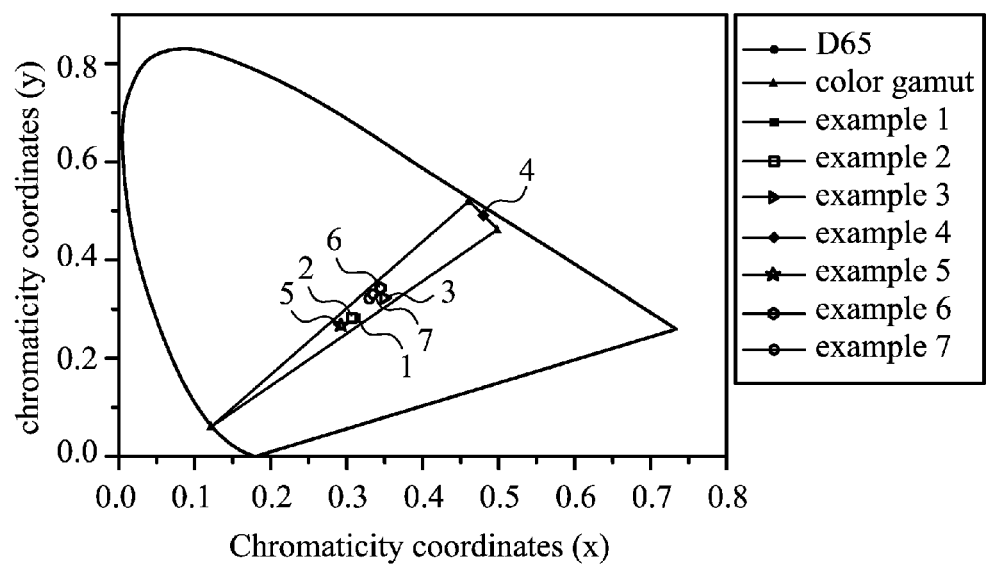
FIG. 8 is an experimental result showing color gamut and color temperature performances of a color temperature tunable white light emitting device according to an embodiment of the invention.

As shown in FIG. 8, experimental results of color gamut, color temperature and chromaticity coordinates in Commission Internationale de l'Eclairage (CIE) color space for the white light emitting device 300, under different operating currents, including the UV LED 104, the purple LED 106 and the blue LED 108, illustrated that tunability of the color temperature of the white light emitting device 300 of the invention in a range of 3000K~9000 K. The point D65 in FIG. 8 represents CIE D65 standard light source as the reference color point.

As discussed above, the color temperature tunable white light emitting device of the invention have the following advantages.

1. A color temperature of the emitted white light is tunable between 3000~9000 K according to user or application requirements, therefore the color temperature tunable white light emitting device can be employed extensively for lighting application.

2. With the omni-directional reflector, the luminous efficacy and UV blocking of the color temperature tunable white light emitting device of the invention is improved.

3. For UV LED, the purple LED and the blue LED used in the color temperature tunable white light emitting device of the invention, the same epitaxial material systems result in similar electrical operation conditions and life time, therefore, the operational stability of the invention can be achieved.

While the invention has been described by way of example and in terms of the preferred embodiments, it is to be understood that the invention is not limited to the disclosed embodiments. To the contrary, it is intended to cover different modifications and similar arrangements (as would be apparent to those skilled in the art). Therefore, the scope of the appended claims should be accorded the broadest interpretation so as to encompass all such modifications and similar arrangements.

What is claimed is:

1. A color temperature tunable white light-emitting device, comprising:
   a substrate;
   an ultraviolet light-emitting diode (UV LED) disposed over the substrate, electrically connected to the substrate, wherein the UV LED has a first emission surface for emitting ultraviolet (UV) light;
   a purple light-emitting diode (purple LED) disposed over the substrate, electrically connected to the substrate, wherein the purple LED has a second emission surface for emitting purple light;
   a blue light-emitting diode (blue LED) disposed over the substrate, electrically connected to the substrate, wherein the blue LED has a third emission surface for emitting blue light;
   a phosphor layer covering the UV LED, the purple LED, and the blue LED, wherein the phosphor layer is formed by blending phosphors of the at least two different colors in a transparent optical resin, and the phosphors are excited by the UV light from the UV LED and the purple light from the purple LED to thereby emit visible light, and combing the blue light from the blue LED to emit white light;
   an omni-directional reflector disposed over the phosphor layer and opposite to the first emission surface of the UV LED, the second emission surface of the purple LED, and the third emission surface of the blue LED;
   a medium layer disposed between the omni-directional reflector and the phosphor layer, wherein the medium layer has a refractive index that is less than a refractive index of the phosphor layer and the omni-directional reflector;
   a transparent substrate disposed over the omni-directional reflector, wherein the transparent substrate has opposite first and second surfaces, and the first surface of the transparent substrate is in contact with the omni-directional reflector; and
   an optical diffuser disposed over the second surface of the transparent substrate.

2. The color temperature tunable white light-emitting device as claimed in claim 1, wherein the medium layer has a refractive index of about 1-1.5.

3. The color temperature tunable white light-emitting device as claimed in claim 2, wherein the medium layer is air.

4. The color temperature tunable white light-emitting device as claimed in claim 1, wherein the phosphors of the at least two different colors in the phosphor layer comprise green, orange, yellow and red colors.

5. The color temperature tunable white light-emitting device as claimed in claim 1, wherein the omni-directional reflector is partially transparent to the white light.

6. The color temperature tunable white light-emitting device as claimed in claim 1, wherein the UV light has a wavelength of about 320~400 nm, the purple light has a wavelength of about 400~450 nm, and the blue light has a wavelength of about 450~490 nm.

7. The color temperature tunable white light-emitting device as claimed in claim 1, wherein the omni-directional reflector comprises a stack of alternate high reflective index layers and low reflective index layers.

8. The color temperature tunable white light-emitting device as claimed in claim 7, wherein the high reflective index layers in the omni-directional reflector have a reflective index of about 2-3 and the low reflective index layers in the omni-directional reflector has a reflective index of about 1.4~1.9.

9. A color temperature tunable white light-emitting device, comprising:
   a substrate;
   a pair of first metal pin, a pair of second metal pin, and a pair of third meta pin disposed along opposite sides of the substrate, respectively;
   an ultraviolet light-emitting diode (UV LED) disposed over the substrate, electrically connected to the pair of first metal pin, wherein the UV LED has a first emission surface for emitting ultraviolet (UV) light;
   a purple light-emitting diode (purple LED) disposed over the substrate, electrically connected to the pair of second metal pin, wherein the purple LED has a second emission surface for emitting purple light;
   a blue light-emitting diode (blue LED) disposed over the substrate, electrically connected to the pair of third metal pin, wherein the blue LED has a third emission surface for emitting blue light;
   a transparent layer covering the UV LED, the purple LED, and the blue LED, wherein the transparent layer comprise materials that are transparent to the UV light, the purple light and the blue light;
   a phosphor layer formed over the transparent layer, wherein the phosphor layer is formed by blending phosphors of the at least two different colors with transparent optical resin, and the phosphors are excited by the UV light from the UV LED and the purple light from the purple LED to thereby emit visible light, and combing the blue light from the blue LED to emit white light;
   an omni-directional reflector disposed over the phosphor layer and opposite to the first emission surface of the UV LED, the second emission surface of the purple LED, and the third emission surface of the blue LED;
   a medium layer disposed between the omni-directional reflector and the phosphor layer, wherein the medium layer has a refractive index that is less than that of the phosphor layer and omnidirectional reflector;
   a transparent substrate disposed over the omni-directional reflector, wherein the transparent substrate has opposite first and second surfaces, and the first surface of the transparent substrate is in contact with the omni-directional reflector; and
   an optical diffuser disposed over the second surface of the transparent substrate.

10. The color temperature tunable white light-emitting device as claimed in claim 9, wherein the medium layer has a refractive index of about 1-1.5.

11. The color temperature tunable white light-emitting device as claimed in claim 10, wherein the medium layer is air.

12. The color temperature tunable white light-emitting device as claimed in claim 9, wherein the phosphors of the at least two different colors in the phosphor layer comprise green, orange, yellow and red colors.

13. The color temperature tunable white light-emitting device as claimed in claim 9, wherein the omni-directional reflector is partially transparent to the white light.

14. The color temperature tunable white light-emitting device as claimed in claim 9, wherein the UV light has a wavelength of about 320~400 nm, the purple light has a wavelength of about 400~450 nm, and the blue light has a wavelength of about 450~490 nm.

15. The color temperature tunable white light-emitting device as claimed in claim 9, wherein the omni-directional reflector comprises a stack of alternate high reflective index layers and low reflective index layers.

16. The color temperature tunable white light-emitting device as claimed in claim 15, wherein the high reflective index layers in the omni-directional reflector have a reflective index of about 2-3 and the low reflective index layers in the omni-directional reflector has a reflective index of about 1.4~1.9.

17. The color temperature tunable white light-emitting device as claimed in claim 15, wherein the UV LED, the purple LED, and the blue LED are electrically connected to the first pair of metal pins, the second pair of metal pins, and the third pair of metal pins by bond wires, respectively, and the bond wires are disposed in the transparent layer.

* * * * *